United States Patent [19]

Wang et al.

[11] Patent Number: 5,776,811

[45] Date of Patent: Jul. 7, 1998

[54] SIMPLIFIED PROCESS FOR FABRICATING FLASH EEPROM CELLS

[75] Inventors: Hsingya Arthur Wang, Saratoga; Jian Chen, San Jose; Paul J. Steffan, Elk Grove, all of Calif.

[73] Assignee: Advanced Micro Devices, Inc., Sunnyvale, Calif.

[21] Appl. No.: 582,720

[22] Filed: Jan. 4, 1996

Related U.S. Application Data

[62] Division of Ser. No. 480,876, Jun. 7, 1995, abandoned.

[51] Int. Cl.$^6$ .............................................. H01L 21/8247
[52] U.S. Cl. ........................................... 438/264; 438/529
[58] Field of Search ...................... 437/30, 43, 44, 437/49, 154; 438/257, 264, 529, 545, 546, 549

[56] References Cited

U.S. PATENT DOCUMENTS

| | | | |
|---|---|---|---|
| 4,804,637 | 2/1989 | Smayling et al. | 437/44 |
| 4,957,877 | 9/1990 | Tam et al. | 437/43 |
| 5,103,274 | 4/1992 | Tang et al. | 257/321 |
| 5,120,671 | 6/1992 | Tang et al. | 437/43 |

*Primary Examiner*—Chandra Chaudhari
*Attorney, Agent, or Firm*—Fliesler, Dubb, Meyer & Lovejoy

[57] ABSTRACT

A simplified fabrication procedure for making flash EEPROM memory cells is disclosed. The method comprises performing a double-diffuse (deep) junction implant after the shallow source/drain of the memory cell have been implanted and formed. A high energy double-diffuse implant is used to replace separate, individual implant and diffusion steps which results in a memory cell having, less damage to its substrate.

7 Claims, 5 Drawing Sheets

SIMPLIFIED PROCESS FOR FABRICATING FLASH EEPROM CELLS

This application is a divisional application of Ser. No. 08/480,876, filed Jun. 7, 1995, now abandoned.

FIELD OF THE INVENTION

The present invention relates generally to semiconductor memory devices, and more particularly to an improved fabrication process for making flash EEPROM memory cells.

BACKGROUND OF THE INVENTION

Flash electrically erasable and programmable read-only memories (EEPROM)'s are a class of nonvolatile memory devices that are programmed by hot electron injection and erased by Fowler-Nordheim tunneling.

Figure 1:
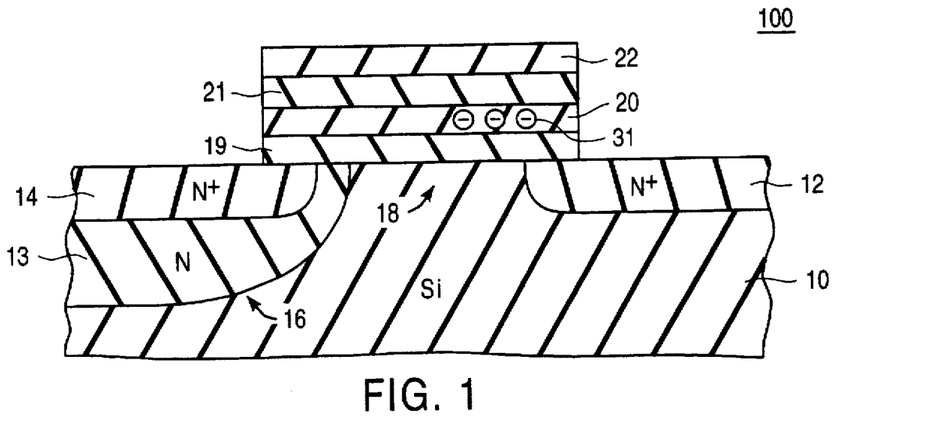
FIG. 1 depicts a cross-sectional view of a conventional flash EEPROM cell.

FIG. 1 illustrates a cross-section of a conventional flash EEPROM memory cell. The cell 100 is formed on a substrate 10, having a heavily doped drain region 12 and a source region 16 embedded therein. The source region 16 further contains a lightly doped deeply diffused region 13 and a more heavily doped shallow diffused region 14 embedded into the substrate 10. A channel region 18 separates the drain region 12 and the source region 16. Separated from the substrate 10 by an oxide layer 19 is a floating gate 20 which is further separated from a control gate 22 by an additional oxide layer 21. A plurality of flash EEPROM cells 100 may be formed on a single wafer.

Flash EEPROM memory cells are programmed by inducing hot electron injection of electrons from the channel region 18 near the drain region 12 to the floating gate 20. Electron injection carries negative charge onto the floating gate 20. This injection mechanism is normally induced by grounding the source region 16, applying a relatively high positive voltage (approximately 12V) to the control gate 22 and applying a moderate voltage (approximately 5V) to the drain region 12 in order to generate high energy (hot) electrons. After sufficient negative charge accumulates onto the floating gate 20, the negative potential of the floating gate 20 rises to a threshold voltage and inhibits current flow through the channel region 18 during any subsequent read mode operation. Typically, in the read mode, a relatively low positive voltage, for example 1.5V, is applied to the drain region 12, 5V is applied to the control gate 22 and 0V is applied to the source region 16 of the memory cell 100. The magnitude of the read current is used in determining whether the EEPROM cell is programmed or not.

Erasing flash EEPROM memory cells is typically carried out by Fowler-Nordheim tunneling between the floating gate 20 and the source region 16 (known as source erase or negative gate erase) or between the floating gate 20 and the substrate 10 (known as channel erase). The source erase operation is induced by applying a high positive voltage (approximately 12V) to the source region 16 and 0V to both the control gate 22 and the substrate 10, while floating the drain region 12 of the memory cell. The negative gate erase operation is induced by applying 5V to the source region 16, a negative voltage (as much as −10V) to the control gate 22 and 0V to the substrate 10, while floating the drain region 12 of the memory cell. The channel erase operation is induced by applying a high positive voltage (approximately 12V) to the substrate 10 and 0V to the control gate 22, while floating both the source region 16 and the drain region 12 of the memory cell 100.

A drawback with conventional EEPROM manufacturing processes is the large number of steps required to produce the memory cell and specifically, the large number of steps required to form the source area of the memory cell. An example of such a fabrication process is illustrated in Table 1, below, which shows the large number of process steps required to fabricate the source area of an EEPROM cell. The larger the number of fabricating steps performed, the greater the amount of time and the more expensive it is to produce a Flash cell.

TABLE 1

1. Self-Aligned Etch Mask
2. Self-Aligned Etch
3. Plasma Strip
4. Caros Strip
5. Self Aligned Source Mask
6. Self Aligned Source Etch
7. Pre-Double Diffuse Implant Pre-clean
8. Pre-Double Diffuse Implant oxidation
9. Double Diffuse Mask
10. Double Diffuse Implant
11. Resist Plasma Strip
12. Caros Strip
13. Double Diffuse Drive pre-clean
14. Double Diffuse Drive (ox)
15. MDD Implant Mask
16. MDD Implant
17. Resist Plasma Strip
18. Resist Strip Caros
19. Pre-implant pre-clean
20. Flash pre-implant oxidation
21. N-LDD Implant
22. P-LDD Implant Mask
23. P-LDD Implant
24. Halo Implant
25. Resist Strip Caros
26. Poly LDD deposition pre-clean
27. Poly LDD deposition
28. Poly LDD etch
29. S/D Implant Mask
30. Implant UV Bake
31. Implant
32. Resist Strip
33. Resist Strip
34. S/D Implant Mask
35. Implant UV Bake
36. Implant
37. Plasma Resist Strip
38. Resist Strip Caros
39. Poly LDD Removal
40. Caros Strip Another drawback with conventional Flash EEPROM manufacturing methods is the inability to control the voltage threshold ($V_t$) distribution of the Flash cell. This results in neighboring cells performing differently which is a performance and a reliability concern. This is particularly true when erasing the flash memory cell. As discussed above, with respect to the source or negative gate erase methods, a voltage is applied to the source region in order to erase the flash cell. Because of the variable $V_t$ distribution associated with conventional fabrications techniques, the situation occurs where one or more of the memory cells may erase faster than the other memory cells on the same die—which leads to the problem of overerasing.

Erasing memory cells is typically performed by application of an erase voltage, as described above, to each of the memory cells over their respective control gates. After each application of an erase voltage, a verify voltage is applied to the memory cells to verify that the memory cell has actually been erased. If a particular memory cell does not conduct a current during verify, indicating that the memory cell is not fully erased, additional erasing voltages are applied until the memory cell conducts. Overerasing occurs because each application of an erase voltage removes electrons from the floating gate of the memory cells, including those cells that have been properly erased. When too many electrons have been removed, the floating gate become positively charged, causing the overerase condition.

A problem caused by overerased cells is column leakage which produces an additional read current on the bit line of the memory cell being read stemming from another memory cell on the same column as the cell being read. This leakage current can cause errors while reading a bit (memory cell) that does not conduct any current. To program a particular memory cell, a positive voltage is applied to the bit line connected to the selected cell while a positive word-line voltage is applied to the respective control gate of the row of cells containing the selected cell, with the respective source lines grounded. The voltages applied to the selected cell create the positive drain-to-source voltage and the large positive gate-to-drain voltage, as discussed above, to enable hot electron injection in the selected cell. During programming, the control gates of the unselected cells are grounded. With an overerased cell on the bit line of the selected cell, 0V on the control gate of the overerased cell will still be above its threshold value, causing it to conduct a leakage current and lower the drain voltage on the bit line of the memory cell that needs to be programmed.

Another drawback with conventional fabrication processes is that by first diffusing a deep junction into the source region and then diffusing a shallow junction into the source region 2 etch steps and 2 drive steps are required. These steps do damage to the substrate and the tunnel oxide separating the substrate and the floating and control gates and remove the top layers of the substrate, thus producing electron traps in the tunnel oxide. By damaging the substrate of a particular memory cell, the $V_t$ distribution is adversely effected, thereby adversely affecting the performance of the memory.

A method of controlling the voltage characteristics of a flash memory cell is to use a self-aligned source process which reduces the size of the memory cell. Such a process is discussed in U.S. Pat. No. 5,120,671, issued Jun. 9, 1992, to Tang, et al. and U.S. Pat. No. 5,103,274, issued Apr. 7, 1992, to Tang, et al.

The drawback associated with the self-aligned source method is that it causes the damage incurred by the substrate and the neighboring tunnel oxide of the memory cell caused by the etching and subsequent driving steps of cell fabrication. The substrate damage that results is non-uniform and leads to the non-uniformity of the shallow source junction which causes erase non-uniformity.

SUMMARY OF THE INVENTION

The present invention solves the aforementioned and related problems associated with conventional flash EEPROM memory cells and the process of fabricating the same.

The present invention provides an improved fabrication process which is simpler and cheaper than conventional process methods and greatly reduces the damage to the substrate when implanting the source region into the substrate. In one fabrication process of the present invention, the source area of the memory cell is self-aligned in accordance with conventional fabrication techniques and a shallow junction is implanted into the source after a pre-double diffuse oxidation; after the shallow junction is formed the double-diffuse (deep) junction is then implanted at a high energy into the already diffused source area. In an alternate fabrication process, the source area is aligned to the gate using conventional SAE fabrication techniques, the shallow junction is then doped and implanted into the substrate and subsequently the deep junction is diffused into the substrate after a high energy implant.

An advantage of the present invention is that the fabrication process requires one less masking step and implanting step which makes the flash memory cell more economic to produce.

Another advantage of the present invention is that the fabrication process is simpler than conventional processes.

A further advantage of the present invention is that it reduces damage to the substrate before the formation of the shallow junction in the source region, thus improving erase uniformity.

A further advantage of the present invention is that it improves tunnel oxide quality.

A feature of the present invention is that it improves the performance of the flash EEPROM memory cell.

BRIEF DESCRIPTION OF THE DRAWINGS

These and other advantages and features of the present invention will become apparent from the following description of the preferred embodiments, taken in conjunction with the accompanying drawings, where like numerals represent like elements, in which.

DETAILED DESCRIPTION OF THE EMBODIMENTS

An improved method for fabricating flash EEPROM memory cells having improved operating characteristics is disclosed. In the following description, numerous details are set forth, for example specific materials, process steps, dimensions, etc., in order to provide a thorough understanding of the present invention. It will be obvious, however, to one skilled in the art that these specific details need not be employed to practice the present invention. In other instances, well-known conventional processing steps are not described in great detail in order not to unnecessarily obscure the present invention.

Figure 2:
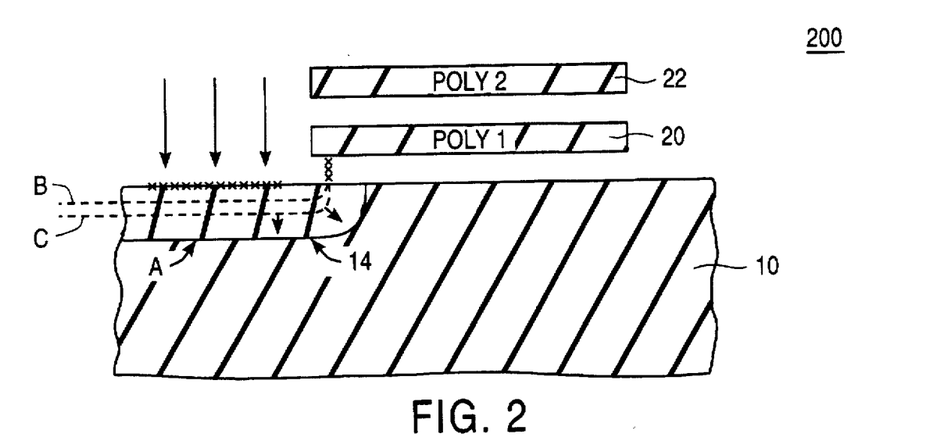
FIG. 2 depicts a cross-sectional view of the source region of an EEPROM memory cell.

With reference to the drawings, FIG. 2 depicts a cross-sectional side view of the source area of a flash EEPROM cell 200. In conventional fabrication techniques, an etch is performed on a region of the substrate 10 (generally silicon) followed by the doping and driving of the etched area with dopant ions that will comprise the source area. After the source area has been defined by a mask and etched, an implant at a relatively low energy (approximately 60 keV) is used to dope the source area. The dopant is diffused deeply into the source area by a high temperature diffusion drive. After the deep diffusion is performed, a second diffusion is performed on the source area to provide the shallow junction as the source area of the memory cell. When etching the source area during the SAS etch, the substrate becomes damaged in that the top layers of the silicon are removed. Thus, the top layer of the source area is lowered from the level planar shape as shown in FIG. 2 to the lower gouged area represented by line B of FIG. 2. When the dopant ions are driven into the substrate to form the source region 14, the silicon is further damaged and a further layer is removed to the point where the top of the source area is located at line C in FIG. 2. Also, during the driving step damage to the tunnel oxide region (shown as X's in FIG. 2), known as oxide gouging occurs which causes traps to be formed within the tunnel oxide area 19 which further affects the $V_t$ distribution of the memory cell, which may result in different memory cells having different erase times causing the column leakage problem discussed above. Ideally, what you would want after the fabrication process is completed is for the top surface of the source to have a planar shape with no layer removal or gouging and to have the floating gate 20 and the control gate 22 overlapping the interior area of the source. The main causes of damage to the silicon area and the tunnel oxide region is the number of etching and masking steps that are required by conventional processes to fabricate the memory cell as depicted in FIG. 1.

Figure 3:
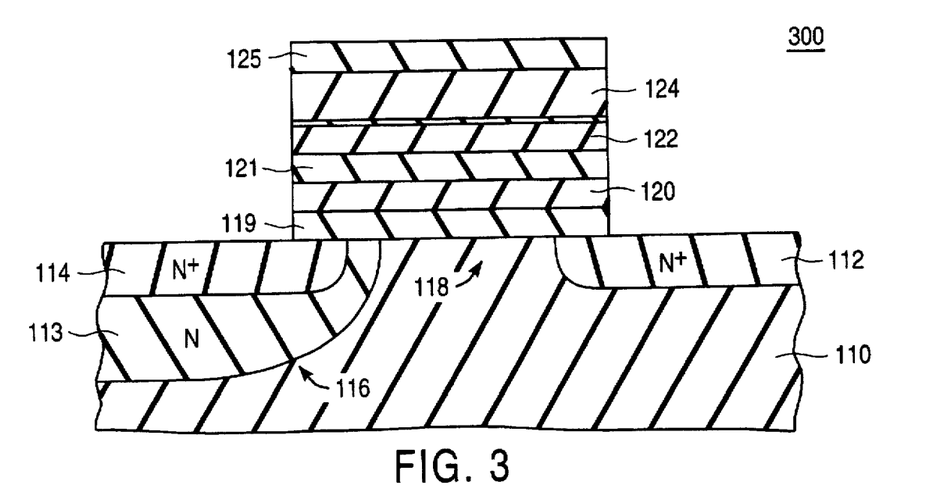
FIG. 3 depicts a cross-sectional view of a flash EEPROM cell fabricated according to the process of the present invention.

FIG. 3 depicts a cross-sectional side view of the flash EEPROM memory cell 300 fabricated in accordance with the preferred method of the present invention. In the preferred embodiment, Flash cell 300 is formed on a P-type substrate 110 (generally silicon) having diffused therein an N+ drain region 112, an N-type double diffused source region 116 and a channel region 118 positioned between the N+ drain region 112 and the double-diffused source region 116. The double diffused source region 116 is formed of a deeply diffused, but lightly doped N well 113 (phosphorous doped), commonly known as a double-diffused junction (DDJ), and a more heavily doped but more shallow N+ well 114 (arsenic doped) embedded within the DDJ 113. A tunnel oxide 119 is formed on the silicon substrate 110. A first polysilicon gate 120 is formed on top of the tunnel oxide 119. Separating the first polysilicon gate 120 and a second polysilicon gate 122 is a three-layer interpoly spacer 121 comprised of one layer of oxide, a layer of nitride formed on said first oxide layer and a second oxide layer formed on top of said nitride layer. Formed on top of the second polysilicon gate 122 is a tungsten silicide layer (optional) 124; and placed on top of that layer is a polysilicon layer 125.

Figure 4:
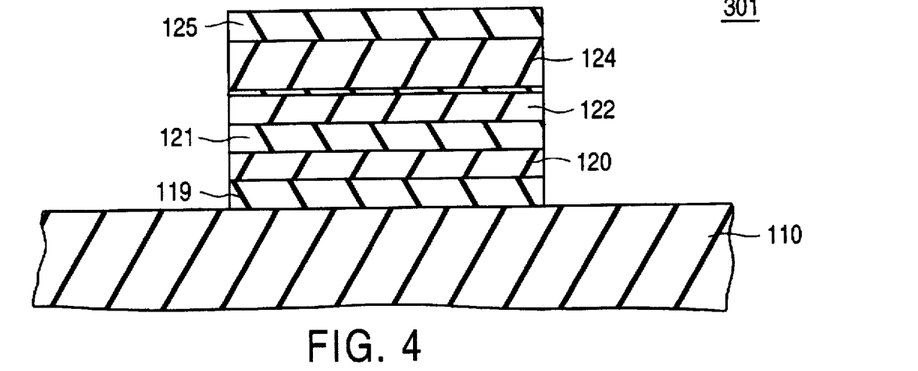
FIG. 4 depicts a cross-sectional side view of a portion of the memory cell of FIG. 3 before implanting of the source region according to the process of the present invention.
Figure 5:
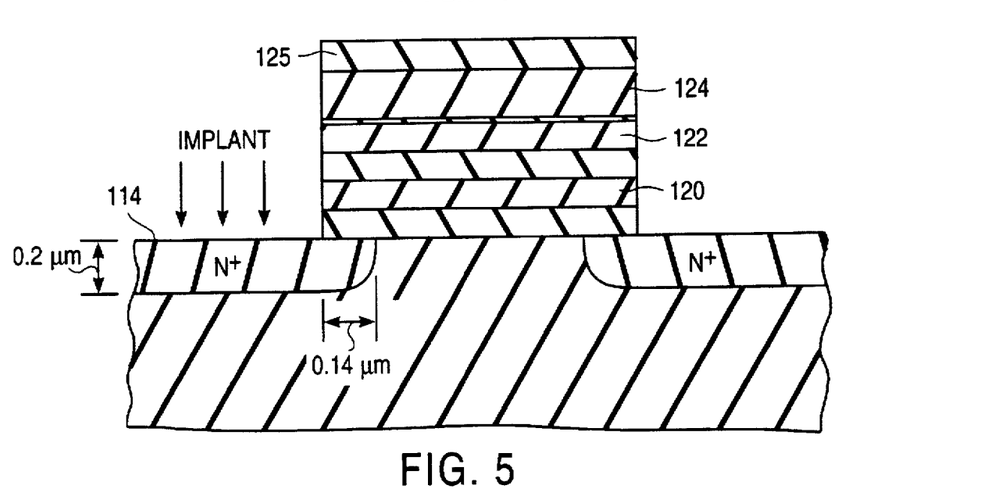
FIG. 5 depicts a cross-sectional side view of a portion of the memory device of FIG. 3 after doping of the source and drain regions of the present invention.

The formation of the Flash cell of FIG. 3 will now be discussed with reference to FIGS. 4–6. Shown in FIG. 4 is a base structure of the memory cell 301 having a P-type substrate 110 separated from a first polysilicon gate 120 by a tunnel oxide region 119. The first polysilicon gate 120, commonly known as the floating gate, is separated from a second polysilicon gate 122, commonly known as the control gate by the interpoly ONO layer 121. Formed on top of the second polysilicon gate 122 is a tungsten silicide layer 124 having a polysilicon layer 125 formed thereon. The fabrication of the interpoly ONO layer 121 is discussed above with reference to FIG. 3.

Continuing with the base structure of FIG. 4 a self-aligned mask is applied to the structure and the source region is etched out, thereby causing the source region to be aligned with the gate area. Next, the shallow junction is diffused into the substrate 110. An implant mask (not shown) is placed over the control gate structure and arsenic (As) N-type dopant ions are implanted at an energy of approximately 60 keV with an implant dose of approximately $7.0 \times 10^{15}$ cm$^{-2}$ into the substrate. The implant is then driven in a dry oxygen atmosphere at 900° C., thus forming the source 114 area as shown in FIG. 5 having a depth of 0.2 μm and overlapping the first polysilicon gate 120 by approximately 0.14 μm. The time and temperature of the drive and oxidation steps may be varied to achieving the described concentrations and junction parameters. After the shallow source region has been driven, photoresist is applied to the memory cell and the doping and formation of the peripheral devices (i.e. bit line voltage controller, word line voltage controller, etc.) is done. After the peripheral devices are formed, the photoresist is removed from the memory cell and the high energy diffusion of the double-diffuse junction is performed.

Figure 6:
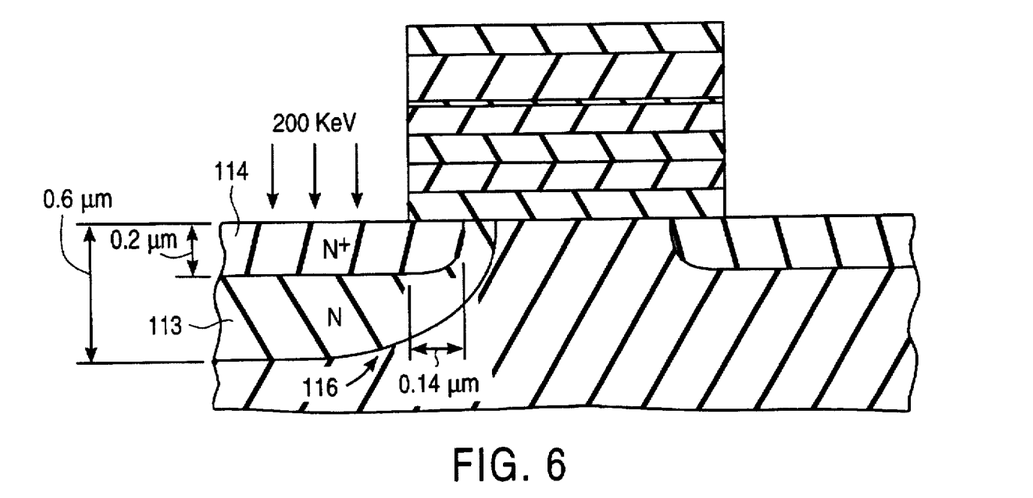
FIG. 6 depicts a cross-sectional view of a portion of the memory cell of FIG. 3 after doping the deep junction source area according to the process of the memory cell of the present invention.

Referring to FIG. 6, a self-aligned source mask (not shown) is placed over the memory cell 301 and phosphorous N-type dopant ions are implanted at an energy of approximately 200 keV with an implant dose of approximately $2.5 \times 10^{14}$ cm$^{-2}$ to provide the deep source junction 113 of the memory cell 301. The deep source junction 113 has a depth of approximately 0.6 μm. The concentration and implant energy may be varied to achieve the desired junction depth. After the high energy implant, the thick oxide is removed by an oxide etch and As, N-type dopant ions are then implanted at an energy of approximately 60 keV with an implant dose of approximately $3.0 \times 10^{15}$ cm$^{-2}$ to provide the overall source area 116 of the memory cell of the present invention. Lastly, metallization to provide contact points for external devices is performed on the memory cell in a conventional manner.

Thus, in the preferred embodiment, the shallow source/drain is diffused into the substrate followed by a high energy diffusion of another dopant into the source thus providing the double-diffused junction. In using this method, the conventional masking and etching steps performed between doping the deep junction and the shallow junction are no longer necessary, thereby saving a masking step and simplifying the process.

Figure 7:
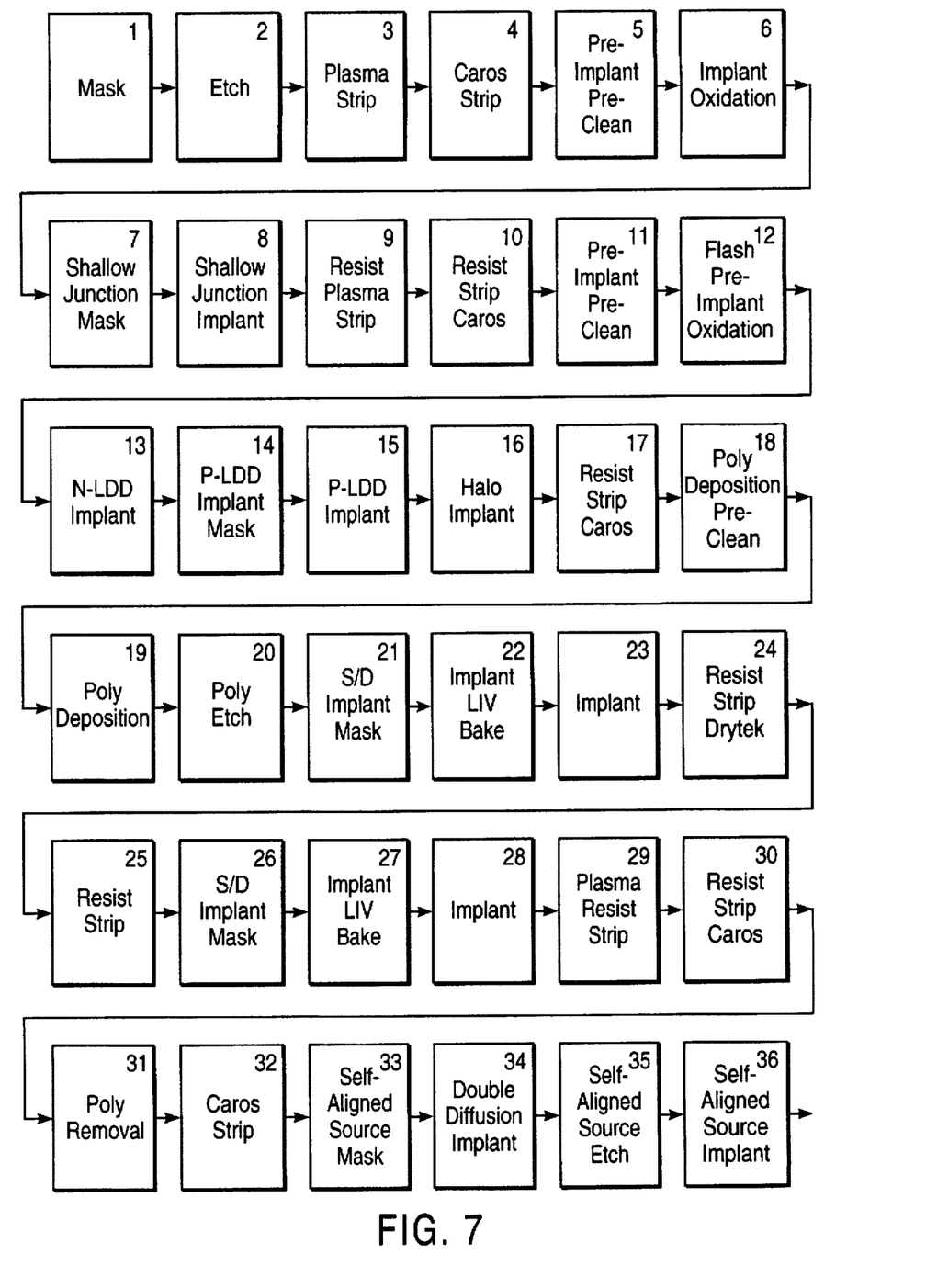
FIG. 7 depicts the process flow of the preferred fabrication process of the present invention.

FIG. 7 shows the process flow of the preferred process of the present invention as applied to a metal oxide semiconductor (MOS) double-poly, poly-spacer memory device. In step 1, a SAE mask is applied to the base structure of the memory cell followed by a plasma etch of fluorine/chlorine chemistry ($C_2F_6$, $SF_6$, He, $Cl_2$ and $O_2$) in step 2, thereby providing the self-aligned etched cell area as shown in FIG. 4. Next, in step 3, the mask is removed by a plasma process followed by removing any remaining organic material and photoresist by using a Caros ($H_2SO_4 + H_2O_2$) strip at a temperature of approximately 150° C. for approximately 20 minutes in step 4. In step 5, a pre-oxidation clean is performed to clean the substrate surface followed by a junction drive at a temperature of approximately 900° C. in a dry oxygen atmosphere in step 6, followed by applying the shallow source/drain implant mask in step 7.

After the mask is applied, As, N-type dopant ions are implanted at an energy of approximately 60 keV with an implant dose of approximately $7 \times 10^{15}$ cm$^{-2}$ in step 8. The implant mask is then removed by plasma in step 9. The remainder of the implant mask is removed in step 10. An oxidation pre-clean is performed in step 11 and the implanted arsenic ions are driven into the substrate at a temperature of approximately 900° C., thereby forming the heavily doped source and drain region of the memory cell in step 12. After the shallow source area has been formed, the peripheral devices (i.e., bit line controller, word line controller, etc.) are formed in a conventional manner. An N-type deep diffusion implant is performed in step 13 followed by applying an implant task in step 14. Boron dopant ions are then implanted at an energy of approximately 28 keV with an implant dose of $1.0 \times 10^{14}$ cm$^{-2}$ in step 15. After that, phosphorous dopant ions having a concentration of $1.6 \times 10^{13}$ cm$^{-2}$ are implanted at an energy of approximately 120 keV in step 16. The mask applied in step 14 is removed in step 17, and a poly deposition pre-cleaning step is performed in step 18. A 2700 Å to 3300 Å layer of polysilicon is then deposited onto the surface it step 19 and subsequently etched in step 20. A source/drain implant mask is then applied in step 21 and is heated under a UV lamp over a temperature range of between room temperature and 200° C. for approximately one to five minutes to cross-link the photoresist which prevents damage to the wafer caused by the implant in step 22. As, N-type dopant ions are implanted at an energy of approximately 60 keV with an implant dose of approximately $7.0 \times 10^{15}$ cm$^{-2}$ in step 23. The implant mask is removed in step 24 and the device is cleaned in step 25. A further source drain implant mask is applied in step 26 and subsequently heated under a UV lamp over a temperature range of between room temperature and 200° C. for approximately one to five minutes in step 27.

The subsequent implantation of boron fluoride P-type dopant ions at an energy of approximately 60 keV with an implant dose of approximately $6.0 \times 10^{15}$ cm$^{-2}$ is done in step 28. A dry plasma resist strip is applied in step 29 to remove the mask and the remaining portions of the mask are removed with a Caros strip at a temperature of approximately 125° C. for approximately 20 minutes is performed in step 30. Any remaining heavily-doped polysilicon is removed in step 31 and a Caros strip used to remove any photoresist and organic materials from the wafer is done in step 32. The preceding steps 13–32 are the conventional steps used to fabricate peripheral devices on the wafer. Once the peripheral devices have been formed, a self-aligned source mask is applied to the semiconductor device in step 33 and phosphorous, N-type dopant ions are implanted at an energy of approximately 200 keV with an implant dose of approximately $2.5 \times 10^{14}$ cm$^{-2}$ in step 34. The implanting of the phosphorous at such a high energy removes the necessity of a subsequent drive step as performed in conventional processes. An oxide etch is performed in step 35 to remove the isolation oxide (field oxide) between neighboring bits along the control gate and to link the source junction followed by another implant of As, N-type dopant ions at an energy of approximately 60 keV with an implant dose of approximately $3.0 \times 10^{15}$ cm$^{-2}$ in step 36. At this point, the double-diffused source structure 116 of FIG. 3 is now complete and formation of contacts and metallization of those contacts to provide a connection to external devices are formed in a conventional manner to thereby provide the Flash EEPROM cell 300 of FIG. 3.

As shown in FIG. 7, the fabrication process for producing a Flash EEPROM cell according to the preferred process of the present invention requires fewer etching and driving steps than required by the conventional method shown in table 1, thus simplifying the process. Also, the masking step which is preformed before the implanting of the source area of the conventional method is not done, thereby making the process cheaper. The reduced number of steps makes the process simpler to complete, thereby providing better control of the device parameters of the resulting Flash EEPROM cell.

Figure 8:
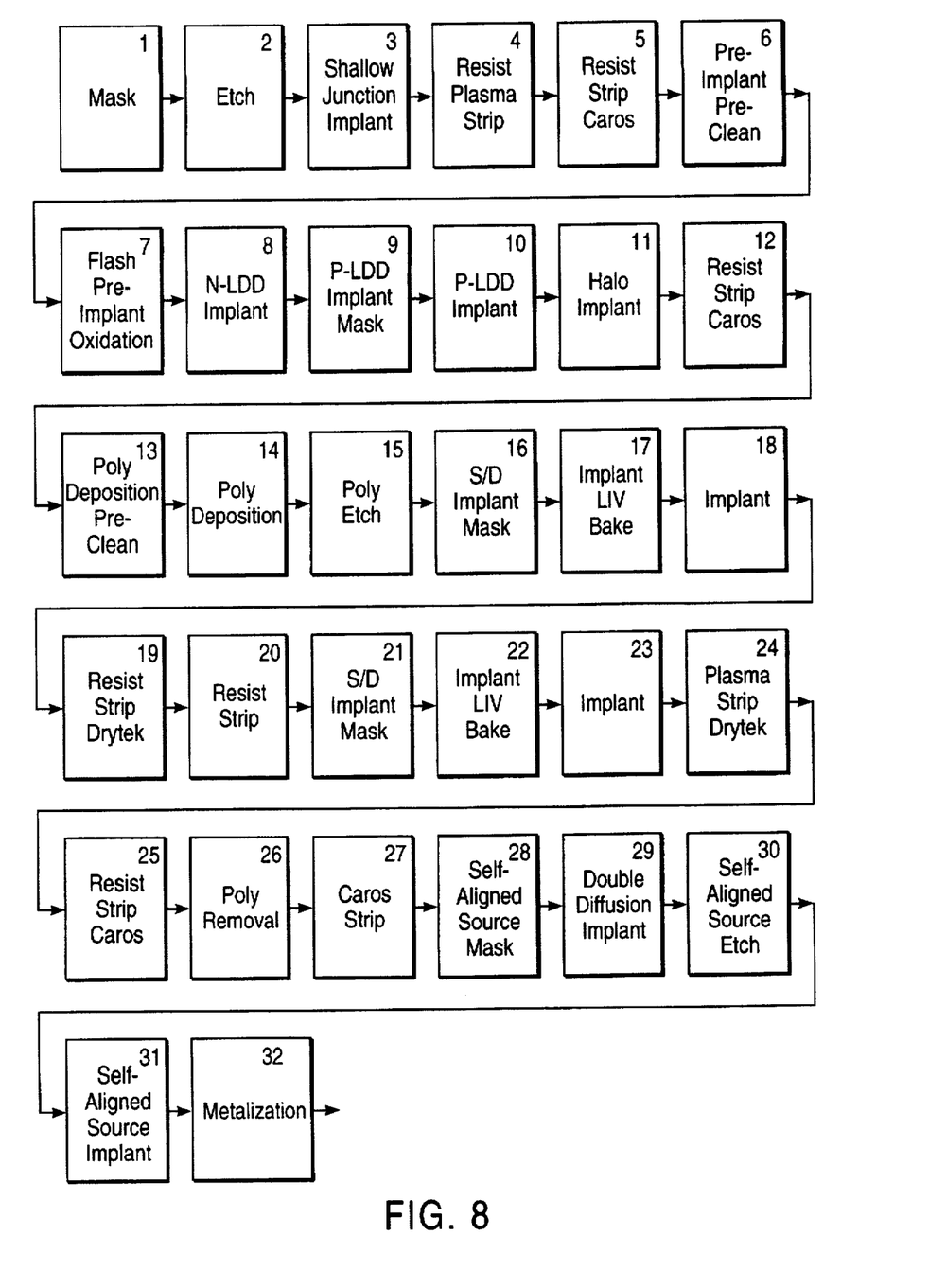
FIG. 8 depicts a process flow of an alternate fabrication process of the present invention.

FIG. 8 shows the process flow of an alternate process of the present invention applied to a MOS double-poly, poly spacer memory device. In step 1, a SAE mask is applied to the base structure shown in FIG. 4 followed by an etch to define the source/drain area in step 2. In step 3, an implant of As, N-type dopant ions at an energy of approximately 60 keV with an implant dolt of $7.0 \times 10^{15}$ cm$^{-2}$ is performed. The SAE mask is removed in step 4 and the wafer is cleaned in step 5 by using an $H_2SO_4/H_2O_2$ Caros strip at 150° C. for approximately 20 minutes. A pre-implant oxidation clean is performed in step 6 and then the implant is driven into the substrate in step 7, thereby producing the shallow source region. The peripheral devices are formed in steps 8–27 in the same fashion as described with respect to FIG. 7 above. A SAS mask is applied in step 28, then phosphorous, N-type dopant ions are implanted at an energy of approximately 200 keV with an implant dose of approximately $2.5 \times 10^{14}$ cm$^{-2}$ in step 29, thereby providing the double-diffused source junction 116 as shown in FIG. 3. Implanting the phosphorous atoms at this high energy removes the second driving step used in conventional fabrication techniques. The field oxide is then etched in step 30 and a subsequent implant of As, N-type dopant ions at an energy of approximately 60 keV with an implant dose of $3.0 \times 10^{15}$ is performed in step 31. After the double-diffuse source has been formed, contact regions and the metallization of the contact regions is performed in a conventional manner to provide contacts between the flash EEPROM cell and an external device in step 32.

The alternate process of the present invention thereby illustrates an even simpler fabrication procedure wherein another four fabrication steps have been removed, thus providing for the manufacture of a flash EEPROM cell at still lower cost. The improved fabrication procedure also provides a better double-diffused source junction of the polyspacer process flow, since the double-diffuse implant was done when no spacer was present in contrast with conventional fabrication techniques.

Figure 9:
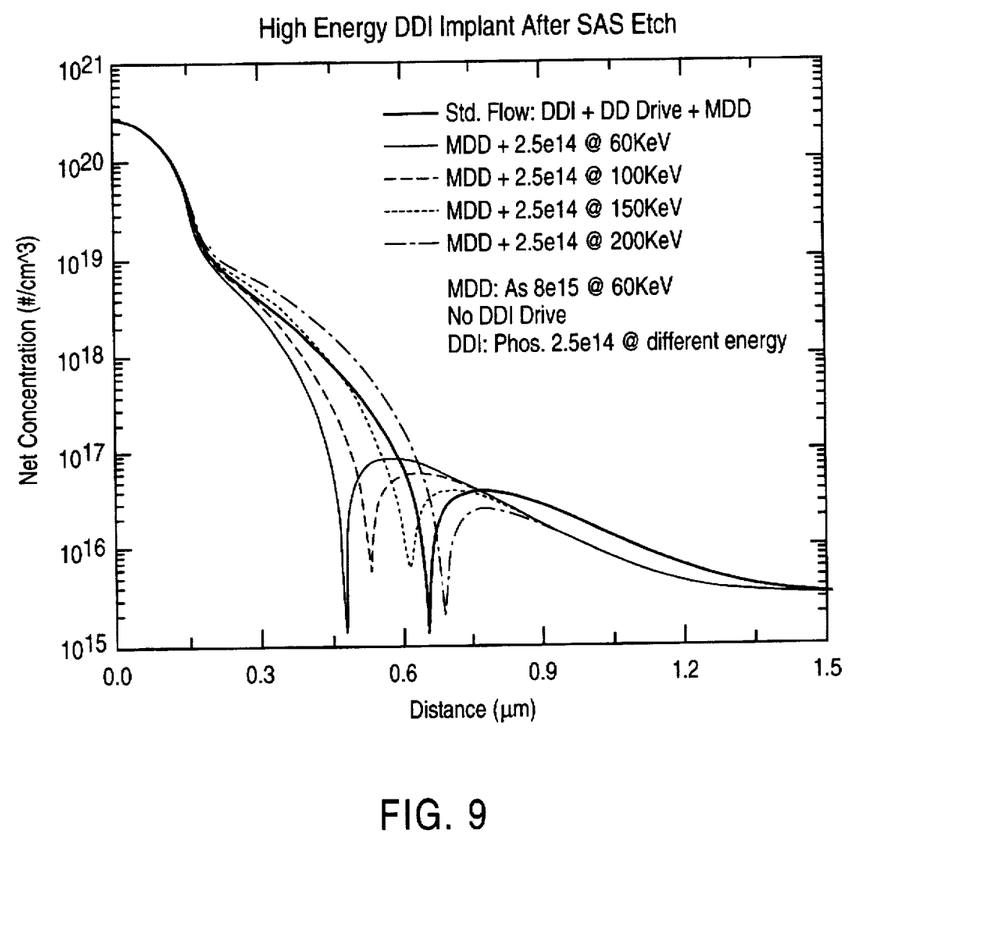
FIG. 9 is a chart comparing the operating characteristics of the device manufactured according to the process of the present convention with the conventional cells.

FIG. 9 shows a chart comparing the operation of the Flash EEPROM memory cell fabricated by the processes of the present invention and conventional fabrication processes. As shown in FIG. 9, the Flash EEPROM cell of the present invention performs equally well; however, it is produced with one less masking step and fewer overall process steps. Thus, operating and performances characteristics have not been compromised with the new fabrication procedures.

The foregoing description of the preferred embodiments of the invention have been presented for purposes of illustration and description. It is not intended to be exhaustive or to limit the invention to the precise form disclosed, and obviously many modifications and variations are possible in light of the above teaching. A simplified process for fabricating flash EEPROM cells was chosen and described in order to best explain the principles of the invention and its practical application to thereby enable others skilled in the art to best utilize the invention in various embodiments and with various modifications as are suited to the particular use contemplated. For example, the spacer described in the application is a polysilicon spacer; however, other spacer types such as oxide, nitride, etc. can be used in accordance with the present invention. It is intended that the scope of the invention be defined by the claims appended hereto.

What is claimed is:

1. A process of forming a semiconductor device on a wafer, comprising the steps of:
   (a) forming a plurality of layers of semiconductor material on said wafer, said plurality of layers providing a floating gate and a control gate;
   (b) implanting a shallow source junction on said wafer by diffusing a first dopant into the substrate, said shallow source junction having a surface;

(c) oxidizing the surface of said shallow source junction directly subsequent to step (b); and (d) implanting a high energy double diffuse source junction on said wafer by diffusing a second dopant into the substrate directly subsequent to step (c), said double diffuse source junction including said shallow source junction and a deep source junction below said shallow source junction.

2. The process of claim 1, further including the steps of:

(e) forming contact regions on said shallow source junction; and (f) forming a metal on said source junction to enable the metal to operate as a contact between said semiconductor device and an external device.

3. The process of claim 1, wherein step (b) further comprises the step of:

(b1) implanting said shallow source junction with arsenic at an energy of about 60 KeV and with an implant dose of about $7.0 \times 10^{15}$ cm$^{-2}$.

4. The process of claim 1, wherein step (d) is performed at an energy range of 30 keV to 300 keV.

5. The process of claim 4, wherein step (d) is performed at an energy of 200 keV.

6. The process of claim 1, wherein said shallow source junction has a depth of about 0.2 µm from the surface of said shallow source junction.

7. The process of claim 1, wherein said deep source junction has a depth of about 0.6 µm from the surface of said shallow source junction.

* * * * *